(12) United States Patent
Liu et al.

(10) Patent No.: US 6,420,248 B1
(45) Date of Patent: Jul. 16, 2002

(54) DOUBLE GATE OXIDE LAYER METHOD OF MANUFACTURE

(75) Inventors: Meng-Chang Liu, Chia-yi; Shea-Jue Wang, Taipei, both of (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/685,423

(22) Filed: Oct. 10, 2000

(51) Int. Cl.[7] .......................................... H01L 21/4763
(52) U.S. Cl. ........................ 438/585; 438/591; 438/424
(58) Field of Search ................................. 438/585, 591, 438/423, 424, 692

(56) References Cited

U.S. PATENT DOCUMENTS

| | | | | |
|---|---|---|---|---|
| 5,920,779 A | * | 7/1999 | Sun et al. | 438/275 |
| 6,080,682 A | * | 6/2000 | Ibok | 438/770 |
| 6,093,659 A | * | 7/2000 | Grider et al. | 438/758 |

* cited by examiner

Primary Examiner—Trung Dang
(74) Attorney, Agent, or Firm—J. C. Patents

(57) ABSTRACT

A method of manufacturing a double gate oxide layer. A substrate has trenches that divide the substrate into a memory circuit region and a logic circuit region. A dielectric layer is formed on the substrate to fill the trenches. The dielectric layer of the logic region is removed, thereby exposing the substrate. An ion implantation step is performed on the substrate of the logic circuit region using a reverse tone mask. A conformal barrier layer is formed over the substrate. A spin-on layer is formed over the barrier layer. A chemical mechanical polishing step is performed to remove the in-on layer, the barrier layer, and dielectric layer outside the trenches, thereby exposing the substrate. A thermal oxidation step is performed to form a double gate oxide layer that is thicker in the logic circuit region than it is in the memory circuit region.

17 Claims, 4 Drawing Sheets

US 6,420,248 B1

DOUBLE GATE OXIDE LAYER METHOD OF MANUFACTURE

BACKGROUND OF THE INVENTION

1. Field of the Invention

The present invention relates to a method of manufacturing integrated circuits. More particularly, the present invention relates to a method of manufacturing a double gate oxide layer having a varying thickness.

2. Description of the Related Art

In recent years the manufacture of integrated circuits has improved dramatically while production costs have continued to decline. As a result, there has been tremendous growth in the development of electronic products that rely on the use of integrated circuits. However, individual devices are not able to adequately support the demands of many of the latest electronic technologies. Thus, the production of devices with a logic circuit and memory circuit on the same chip (System on Chip) SOC is becoming more common.

There are important considerations related to the integration of logic and memory devices on the same chip. With regard to the logic device, an important consideration is operating speed. When the logic device operates under low voltage conditions its transistor is smaller than that of the memory device and the gate oxide layer is thinner. On the other hand, reliability and stability are important considerations with regard to the memory device. The memory device usually operates under high voltage, the gate oxide layer of its transistor is thicker than the logic device.

Additionally, when conventional shallow trench isolation structures are formed, a chemical mechanical polishing process is used to remove silicon dioxide from the top of the active region, leaving silicon dioxide remaining in the trench structure. However, the silicon nitride layer that covers the active region is harder than the silicon dioxide layer. Thus, when a polishing step is performed to expose the silicon nitride layer, difficulties are encountered. As a consequence, dishing easily occurs in the shallow trench structures.

Hence, the conventional method of manufacture provides a double gate oxide layer that attempts to complement both operational speed and reliability and seeks to mitigate problems in the formation of shallow trench isolation structures.

As shown in FIG. 1A, a silicon nitride layer 102 is formed on a substrate 100. A plurality of trenches 104 is formed in the substrate 100 to define active areas (not shown) of the substrate 100. A silicon dioxide layer 106 is formed over the silicon nitride layer 102 to fill the trenches 104.

As shown in FIG. 1B, a photoresist layer 108 is formed over the silicon dioxide layer 106. Through a reverse tone mask procedure, part of the silicon dioxide layer 106, on top of a large area active areas is removed. A silicon dioxide layer 106a remains on the silicon nitride layer 102.

As shown in FIG. 1C, the photoresist layer 108 is removed. The silicon dioxide layer 106a is removed using a mechanical polishing procedure until the substrate 100 is exposed. A silicon dioxide layer 106b remaining from the silicon dioxide layer 106a forms isolation structures in the trenches 104.

A double gate oxide layer is then formed by the following steps. As shown in FIG. 1D, a first thermal oxidation process is performed on the substrate 100 to form an oxide layer 110 on the substrate 100.

As shown in 1E, a photoresist layer 112 is formed to cover a portion of the oxide layer 110. A lithographic etching procedure is conducted to remove oxide layer 110 from the area on the substrate 100 designated as a logic circuit region. The silicon oxide layer 110a covered by the photoresist layer 112 is not removed.

As shown in FIG. 1F, after the photoresist layer 112 has been removed, a second thermal oxidation process is performed on the entire substrate 100, a thin oxide layer 110b is formed on the substrate 100 designated as the logic circuit region to serve as a gate oxide layer.

The area on the substrate 100 designated as a memory circuit region includes oxide layers 110a and 110b. Together these two oxide layers 110a and 110b form the gate oxide for the memory circuit region. Based on the foregoing, the gate oxide layer of the memory circuit region is thicker than the gate oxide layer of the logic circuit region.

However, there are some problems occur in the above-stated method. Because the gate oxide layer on the active areas of the high-voltage device comprises two oxide layers 110a and 110b that are formed in different steps, interface exists between the two oxide layers 110a and 110b. This, in turn, weakens the endurance of the gate oxide layer for high voltage operation. Although an annealing process can be performed to mitigate this problem, annealing can not entirely reduce the presence of interface between the two oxide layers 110a and 110b. Consequently, the adverse affects cause by the presence of interface cannot be entirely eliminated.

Additionally, when the second thermal oxidation process for forming the oxide layer 110b is conducted, in the memory circuit region of high-voltage device, oxygen is diffused through the oxide layer 110a to react with silicon of the substrate, so as to form silicon dioxide. Thus, the second oxide layer 110b formed in the memory circuit region is thinner than the second oxide layer 110b formed in the logic circuit region. Even though the gate oxide layer, in the memory circuit region, including a oxide layers 110a and 110b is thicker than the second oxide layer 110b formed in the logic circuit region. However, the difference in thickness of the second oxide layer 110b across regions leads to difficulties in controlling the thickness of the gate oxide layer in the memory circuit region.

Furthermore, when the chemical mechanical process forming shallow trench isolation structures is conducted, a reverse tone mask is used to perform lithographic etching. Additionally, when a gate oxide layer having a varying thickness is formed, another lithographic etching procedure is conducted. The frequent use of mask and lithographic procedures in the process of manufacturing a semiconductor is an indication of the complexity of the conventional method of manufacture.

SUMMARY OF THE INVENTION

The invention provides a method of manufacturing a double gate oxide layer. A substrate has trenches that divide the substrate into a memory circuit region and a logic circuit region. A dielectric layer is formed on the substrate to fill the trenches. The dielectric layer of the logic region is removed, thereby exposing the substrate. An ion implantation step is performed on the substrate of the logic circuit region using a reverse tone mask. A conformal barrier layer is formed over the substrate. A spin-on layer is formed over the barrier layer. A chemical mechanical polishing step is performed to remove the spin-on layer, the barrier layer, and dielectric layer outside the trenches, thereby exposing the substrate. A thermal oxidation step is performed to form a double gate oxide layer that is thicker in the logic circuit region than it is in the memory circuit region.

The ion implantation step of the invention, creates differences in the speed of substrate oxidation within the logic circuit region and the memory circuit region. In the subsequent stage of manufacture, the thermal oxidation step simultaneously forms a double gate oxide layer having a varying thickness. Thus, concern that interface will form between the thicker gate layers is unnecessary. Moreover, the ion implantation step can be performed using the same reverse tone mask for forming shallow trench isolation structures, eliminating the need for the additional photoresist step. Thus, the method of this invention involves less complexity.

The conventional method of manufacturing a double gate oxide layer requires two thermal oxidation steps to complete. Moreover, during the lithographic etching process of forming the oxide layer, the alternating steps of thermal oxidation and lithographic etching may create pollutants, which affect the quality of the double gate oxide layer.

The method of creating the double gate oxide layer having a varying thickness does not require a mask for patterning the gate oxide layer. Reducing the number of photoresist and lithographic etching steps simplify the process of manufacture and enhances productivity.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

FIG. 3B is the same with the steps of the FIG. 2D.

DESCRIPTION OF THE PREFERRED EMBODIMENTS

Figure 1A:
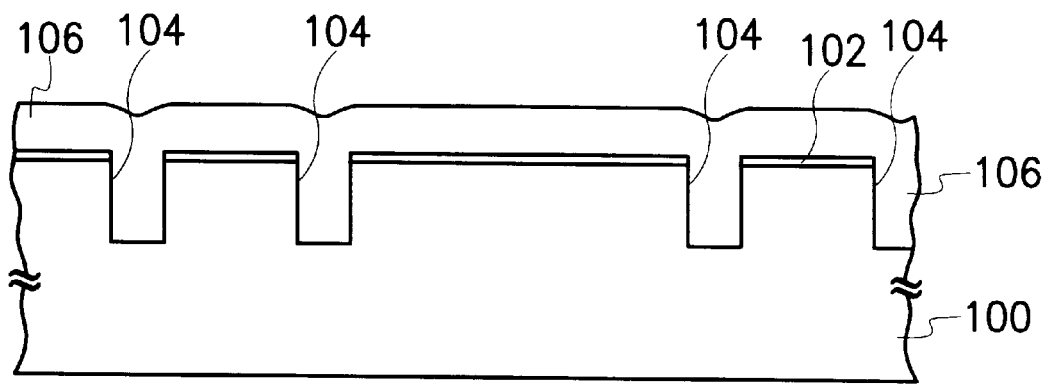
FIGS. 1A–1F shows a conventional process for forming a double gate oxide layer.
Figure 1B:
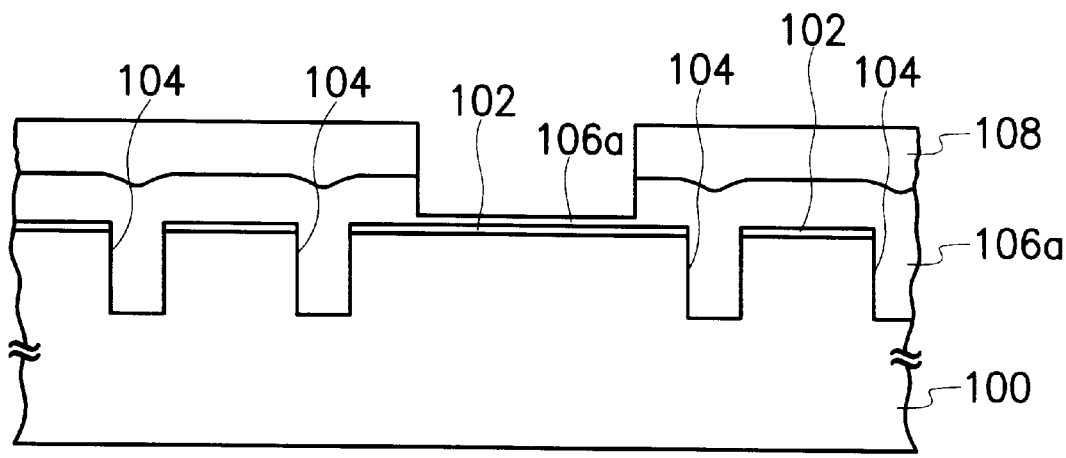
Figure 1C:
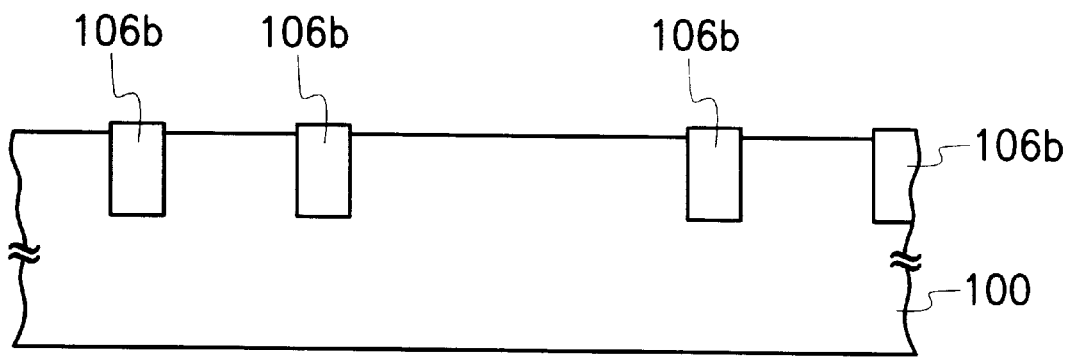
Figure 1D:
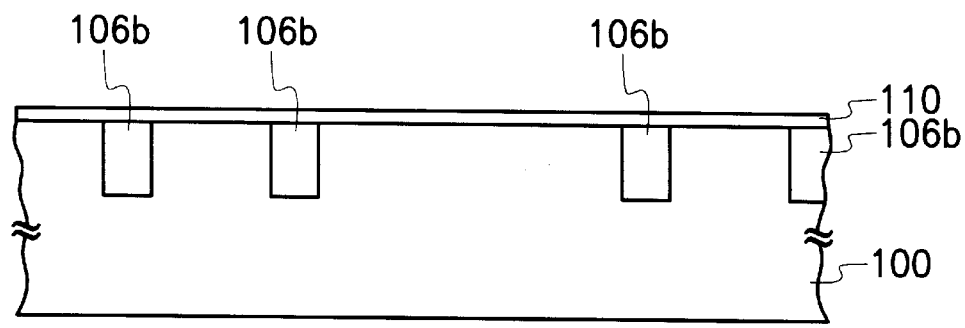
Figure 1E:
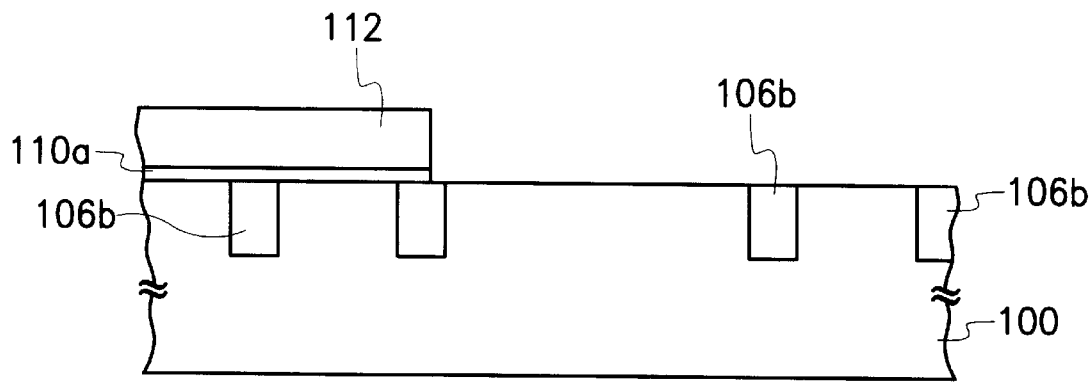
Figure 1F:
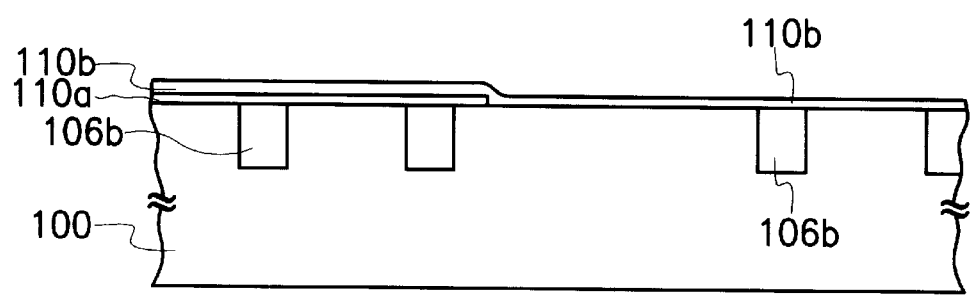

Reference will now be made in detail to the present preferred embodiments of the invention, examples of which are illustrated in the accompanying drawings. Wherever possible, the same reference numbers are used in the drawings and the description to refer to the same or like parts.

Figure 2A:
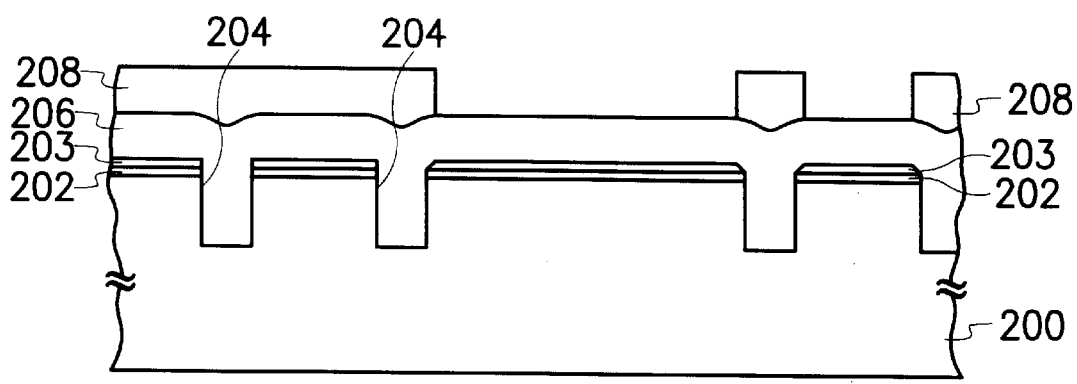
FIGS. 2A–2D are schematic, cross-sectional views of a fabrication method for forming a double gate oxide layer in a preferred embodiment according to the invention.

As shown in FIG. 2A, a sacrificial oxide layer 202 and a barrier layer 203 are sequentially formed over a substrate 200. The material of the barrier layer 203 is preferably one that has a polishing or etching selectivity greater than silicon oxide. Thus, the preferred material of the barrier layer 203 is silicon nitride with an original thickness between 1000 and 2000 Å. Trenches 204 are formed within substrate 200 dividing the substrate 200 into a plurality of memory and logic circuit regions (not shown here). The area of the logic circuit region is generally larger than the area of the memory circuit region. Moreover the device formed in the logic circuit region is generally more dense.

Subsequently, a dielectric layer 206 is formed which covers the substrate 200 and fills the trenches 204. A photoresist layer 208 is then formed over the dielectric layer 206. Using a reverse tone mask procedure, the photoresist layer 208 is patterned. The patterned photoresist layer 208 exposes portions of the dielectric layer 206 of the logic circuit region.

Figure 2B:
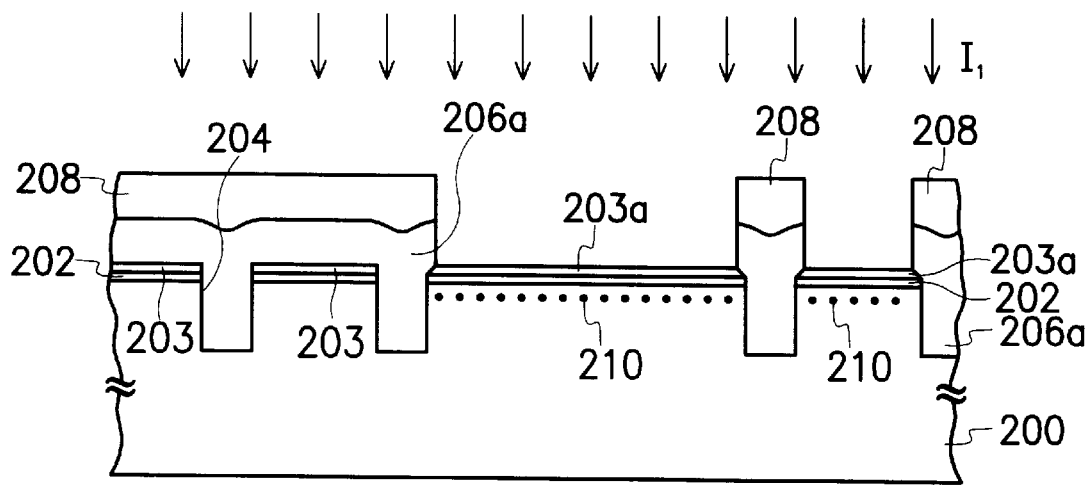
Figure 2C:
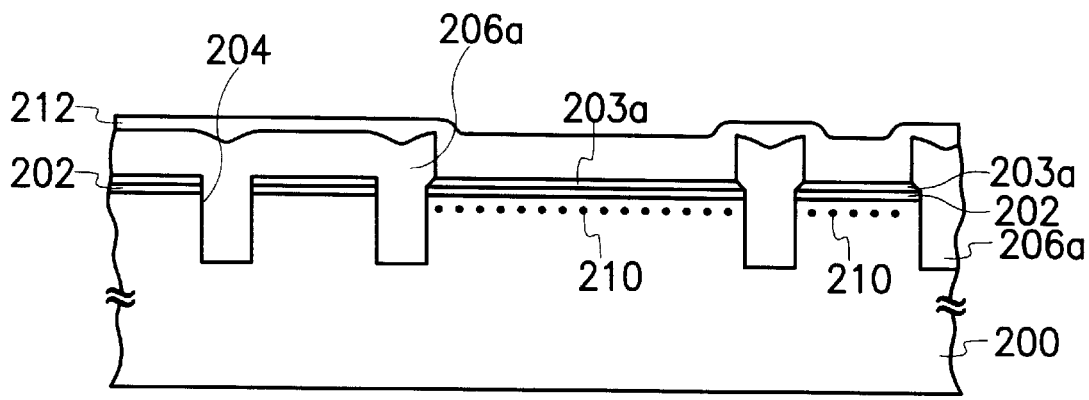

As shown in FIG. 2B, the dielectric layer 206 of the logic circuit region exposed by the photoresist layer 208 is removed by, for example, partial etching step. The barrier layer 203a thus is exposed, leaving the dielectric layer 206a. The resultant thickness of the barrier layer portions 203a has a thickness of about 50 angstroms to about 400 angstroms after the partial etching step is performed. Moreover, using the photoresist layer 208 as a mask, ion implantation $I_1$ is carried out to form doped region 210 in the substrate 200 of the logic circuit region. Implantation step $I_1$ includes doping the substrate 200 with nitrogen having a dosage between $4 \times 10^{13}$ and $1 \times 10^{17}$ atom/cm$^3$ at a doping energy of 30–80 Kev.

As shown in 2C, after the photoresist layer 208 is removed, a spin-on layer 212 is formed over the dielectric layer 206a and barrier layer 203. The material of the spin-on layer 212 includes slurry, photoresist material. Alternatively, the spin-on layer 212 can be formed by depositing a silicon oxy-nitride layer and then coating photoresist material, for example.

Figure 2D:
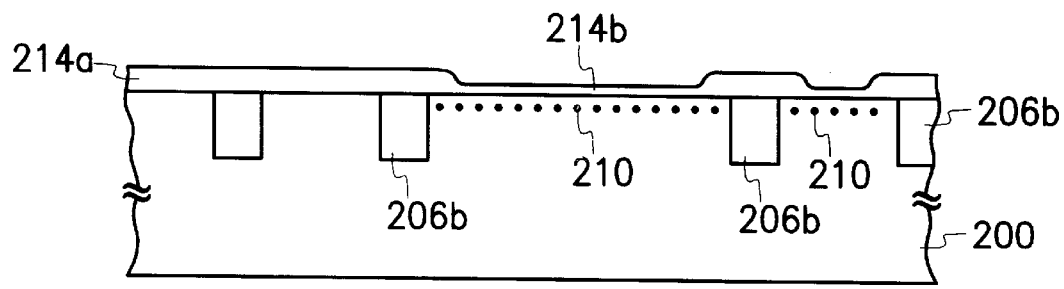

As shown in FIG. 2D a chemical mechanical polishing procedure is conducted to expose substrate 200 by removing spin-on layer 212, barrier layer 203, sacrificial oxide layer 202. Additionally, dielectric layer 206a on the outside of the trenches 204 is removed, leaving dielectric layer 206b in the trenches 204 which form shallow trench isolation structures.

A thermal oxidation process is performed to form gate oxide layers 214a and 214b on the substrate 200. In a prior step, a doped region 210 was formed on the substrate surface 200 of the logic circuit region. The substrate surface of the memory circuit region is not doped, however. The presence of the doped region 210 decreases the speed of the silicon and oxide reaction forming the silicon oxide layer. Thus, although the gate oxide layer of the memory circuit region 214a and the gate oxide layer of the logic circuit region 214b are formed by the same thermal oxidation process, the gate oxide layer of the memory circuit region is thicker.

Additionally, barrier layer 203 may be removed when the reverse tone mask is applied to remove dielectric material from the top of the logic circuit region 206. If this should occur, the steps in the process are amended in the manner explained below.

Figure 3A:
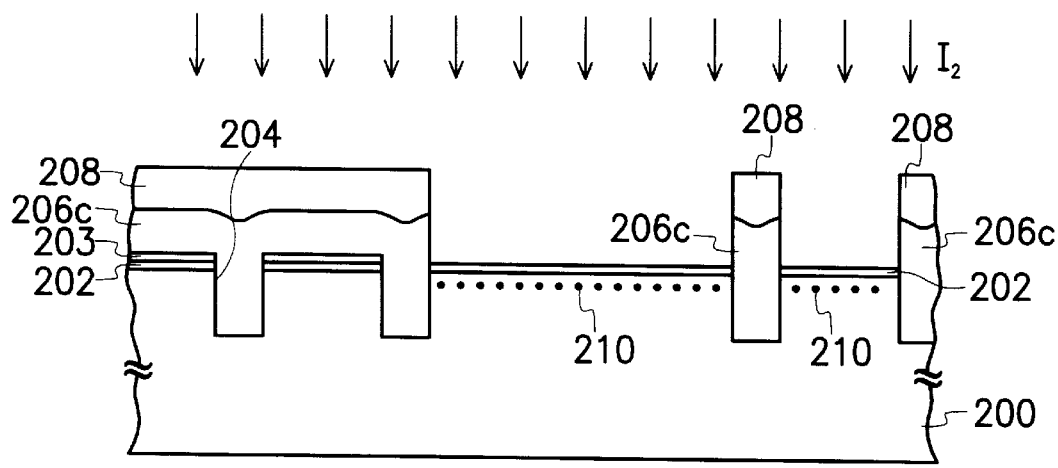
FIGS. 3A and 3B show the process of removing the dielectric layer on top of the logic circuit substrate of FIG. 2A. The steps performed after
Figure 3B:
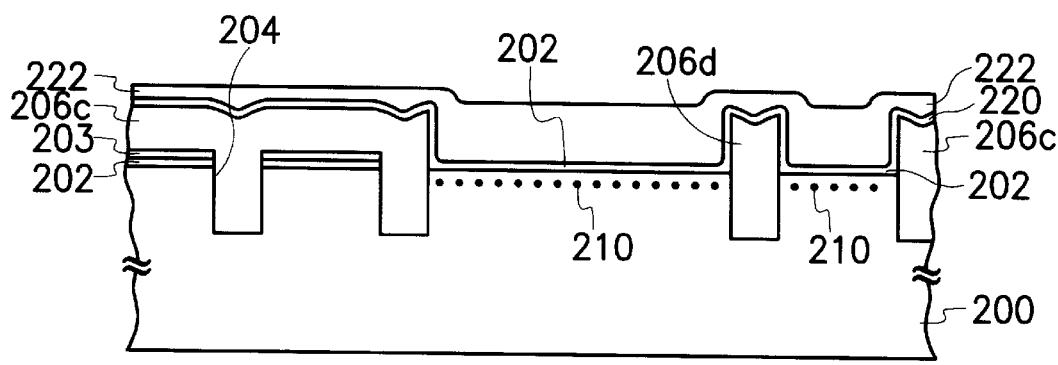

FIGS. 3A and 3B show the process after FIG. 2A. The steps performed after FIG. 3B is the same with the steps of FIG. 2D.

As shown in FIG. 2A using a reverse tone mask, the photoresist 209 is defined. Then, referring to FIG. 3A, the dielectric layer 206 and the barrier layer 203 are removed from the top the substrate of the logic circuit region to leave a sacrificial oxide layer 202 and a dielectric layer 206c. Using the photoresist layer 208 as a mask, ion implantation $I_2$ is conducted, forming a doped region 210 on the surface of the logic region substrate 200. Implantation step $I_2$ includes doping the substrate with nitrogen having a dosage between $4 \times 10^{13}$ and $1 \times 10^{17}$ atom/cm$^3$ at a doping energy of 30–80 Kev.

As shown in 3B, the photoresist layer 208 is removed and a barrier layer 220 is formed, completely covering the dielectric layer 206c. A spin-on layer 212 is formed on the barrier layer 220. The sacrificial oxide layer 202 and the dielectric layer 206c are composed of silicon dioxide. The sacrificial oxide layer 202 thus cannot provide an adequate barrier. Therefore, barrier layer 220 is needed to be formed. The material for the barrier layer 220 is preferably silicon oxynitride with a thickness between 600 and 2000 Å.

A chemical mechanical polishing procedure is conducted forming shallow trench isolation structures. A thermal oxidation step is performed to form a double gate oxide layer. Referring to the description of FIG. 2D, these steps have already been described in detail above.

This method of the invention uses a thermal oxidation step to form a double gate oxide layer having a varying thickness. Concern that interface will appear between the gate oxide layers of the memory cell is unnecessary. Thus, compared to conventional gate oxide layers, the gate oxide layer of this invention has greater reliability.

The oxidation rate of the substrate is determined by whether or not the substrate is doped. Moreover, the ion implantation step can be performed using the same reverse tone mask for forming shallow trench isolation structures, eliminating the need for the additional photoresist step. Thus, the additional lithographic mask process is unnecessary.

Moreover, the formation of the thermal oxidation layer is a continuous step. Thus, concern that photoresist material or other pollutants will affect the quality of the double gate oxide layer is unnecessary.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a double gate oxide layer comprising the steps of:

providing a substrate having a plurality of trenches which divide the substrate into a memory circuit region and a logic circuit region;

forming a dielectric layer on the substrate to fill the trenches;

removing the dielectric layer of the logic region, thereby exposing the substrate;

performing an ion implantation step on the substrate of the logic circuit region using a reverse tone mask;

forming a conformal barrier layer that completely covers the substrate;

forming a spin-on layer over the barrier layer;

performing a chemical mechanical polishing step to remove the spin-on layer, the barrier layer, and dielectric layer outside the trenches, thereby exposing the substrate; and performing a thermal oxidation step to form a double gate oxide layer that is thicker in the memory circuit region than it is in the logic circuit region.

2. The method of claim 1, wherein a concentration for the ion implantation within a range between $4 \times 10^{13}$ and $1 \times 10^{17}$ atom/cm$^3$.

3. The method of claim 1, wherein a doping energy of the ion implantation step for implanting nitrogen into the substrate is within a range between 30 and 80 Kev.

4. The method of claim 3, wherein a concentration for the ion implantation is between $4 \times 10^{13}$ and $1 \times 10^{17}$ atom/cm$^3$.

5. The method of claim 1, wherein a material of the barrier layer comprises silicon oxy-nitride.

6. The method of claim 5, wherein a thickness of the barrier layer is between 600 and 2000 Å.

7. The method of claim 1, wherein a material of the spin-on layer is slurry, photoresist material, or silicon oxynitride combined with photoresist material.

8. The method of claim 1, wherein the thermal oxidation layer is performed at a temperature between 700° and 1200° Celsius.

9. A method of manufacturing a double gate oxide layer comprising the steps of:

sequentially forming a sacrificial oxide layer and a barrier layer over a substrate provided;

patterning the substrate to form a plurality of trenches which divide the substrate into a memory circuit region and a logic circuit regions;

forming a dielectric which covers the barrier layer and fills the trenches;

patterning the photoresist, which exposes the dielectric layer of the logic circuit region;

conducting an ion implantation step, to form doped regions in the substrate of the logic circuit region;

removing the photoresist layer;

covering a remaining part of the dielectric layer and barrier layer with a spin-on layer;

performing a chemical mechanical polishing operation to remove the spin-on layer, the barrier layer, the sacrificial oxide layer and the dielectric layer outside the trenches; and conducting thermal oxidation to form a double gate oxide layer on the substrate.

10. The method of claim 9, wherein the material for the barrier layer includes silicon oxy- nitride with a thickness between 1000 and 2000 Å.

11. The method of claim 9, wherein a concentration of the ion implantation is between $4 \times 10^{13}$ and $1 \times 10^{17}$ atom/cm$^3$.

12. The method of claim 9, wherein a doping energy of the ion implantaion satep for implanting nitrogen into the substrate is between 30 and 80 Kev.

13. The method of claim 9, wherein a material of the spin-on layer is slurry, photoresist material, or silicon oxynitride combined with photoresist material.

14. The method of claim 9, wherein the thermal oxidation layer is formed at a temperature between 700° and 1200° Celsius.

15. A method of manufacturing a double gate oxide layer comprising the steps of:

providing a substrate with a plurality of trenches that divide the substrate into a logic circuit region and a memory circuit region;

conducting an ion implantation step, to form doped regions in the substrate of the logic circuit region; and performing a thermal oxidation step to form a double gate oxide layer that is thicker in the memory circuit region than it is in the logic circuit region.

16. The method of claim 15, wherein a doping energy of the ion implantation step for implanting nitrogen into the substrate is between 30 and 80 Kev.

17. The method of claim 15, wherein a concentration for the ion implantation step is between $4 \times 10^{13}$ and $1 \times 10^{17}$ atom/cm$^3$.

* * * * *